United States Patent
Adams et al.

(10) Patent No.: US 7,827,018 B2
(45) Date of Patent: Nov. 2, 2010

(54) METHOD AND COMPUTER PROGRAM FOR SELECTING CIRCUIT REPAIRS USING REDUNDANT ELEMENTS WITH CONSIDERATION OF AGING EFFECTS

(75) Inventors: Chad A. Adams, Byron, MN (US); Rajiv V. Joshi, Yorktown Heights, NY (US); Rouwaida N. Kanj, Round Rock, TX (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 524 days.

(21) Appl. No.: 11/941,183

(22) Filed: Nov. 16, 2007

(65) Prior Publication Data

US 2009/0132849 A1   May 21, 2009

(51) Int. Cl.
*G06F 17/50* (2006.01)
(52) U.S. Cl. .............................. 703/14; 714/6; 714/10; 714/11; 714/30; 714/733; 714/734
(58) Field of Classification Search .................. 703/14; 714/6, 10, 11, 30, 733, 734
See application file for complete search history.

(56) References Cited

U.S. PATENT DOCUMENTS

| | | |
|---|---|---|
| 2006/0203581 A1 | 9/2006 | Joshi et al. |
| 2007/0141731 A1 | 6/2007 | Hemink et al. |
| 2007/0220455 A1 | 9/2007 | Joshi et al. |

*Primary Examiner*—Kamini S Shah
*Assistant Examiner*—Saif A Alhija
(74) *Attorney, Agent, or Firm*—Mitch Harris, Atty at Law, LLC; Andrew M. Harris; Libby Z. Toub (57) ABSTRACT

A method and computer program for selecting circuit repairs using redundant elements with consideration of aging effects provides a mechanism for raising short-term and long-term performance of memory arrays beyond present levels/yields. Available redundant elements are used as replacements for selected elements in the array. The elements for replacement are selected by BOL (beginning-of-life) testing at a selected operating point that maximizes the end-of-life (EOL) yield distribution as among a set of operating points at which post-repair yield requirements are met at beginning-of-life (BOL). The selected operating point is therefore the "best" operating point to improve yield at EOL for a desired range of operating points or maximize the EOL operating range. For a given BOL repair operating point, the yield at EOL is computed. The operating point having the best yield at EOL is selected and testing is performed at that operating point to select repairs.

20 Claims, 5 Drawing Sheets

METHOD AND COMPUTER PROGRAM FOR SELECTING CIRCUIT REPAIRS USING REDUNDANT ELEMENTS WITH CONSIDERATION OF AGING EFFECTS

BACKGROUND OF THE INVENTION

1. Technical Field

The present invention relates generally to circuit production methodologies using redundant elements for repair, and more particularly to a method and computer program for optimally selecting elements for repair using redundancies by considering aging effects.

2. Description of the Related Art

Improvement in performance and yield in memory arrays is presently provided by provision of redundant circuit elements. Depending on memory organization, extra row or column circuits are included in the memory array circuit, and depending on production test results, if an array element fault is detected, the column or row can be replaced, or in some implementations, individual cells may be replaced. The replacement process typically uses metal layer fuses or masks, or replacement logic responsive to stored values. The masks, fuses or values can be altered during the production process to effect the replacement of the column/row or individual cells. The fault may be that a cell or row/column is un-writable or unreadable, or the fault may be a failure to meet a specified performance criteria such as read timing margins or minimum write time/write stability under all operating conditions.

Due to the number of redundant elements typically provided in a repairable array, a selection is typically made to provide the best possible performance among the possible combinations of repairs. The provision of redundancy and the selection flexibility can provide yields at the level of 5σ and beyond for the initial production yield, provided sufficient redundant elements are supplied. Optimized selection of the repair elements can be performed to provide present-time normalization of the device with respect to "process corners" for each design or at least each production run, so that at initial production, the device is positioned as close as possible to the theoretical nominal device, within the limitations of the number of redundant elements not already used to repair hard faults or elements that fall outside of minimum/maximum specified performance parameters. However, such repair selection results in an optimization of yield that takes into account only the performance at the beginning of life of the device.

Electronic devices in general, and very small feature devices such as memory arrays specifically, have limited lifetime due to various aging effects. The mean time between failure (MBTF) of a memory array is a consideration of long-term performance, and therefore the robustness of the design typically must exceed the level of initial performance by some factor, in order to ensure that the minimum level of performance is maintained throughout the expected lifetime of the device. Of particular concern are effects such as negative bias temperature instability (NBTI), which makes P-MOS devices weaker under stress applied over time due to diffusion of materials in the gate oxide. Also more recently of concern is positive bias temperature instability (PETI), which has an opposite effect on operating point. Since aging effects are a time/stress and time/temperature relationship, long-term aging effects may in fact be short-term, depending on stress levels applied. Therefore, in general, memory array designs are made sufficiently robust to ensure proper operation over all environmental ranges (e.g., temperature and supply voltage) for the design lifetime of the device.

Aging effects are typically compensated-for by testing a larger number of process corners that are extended in range to accommodate the expected margin needed throughout the life of the product. However, the additional test time and resources required to perform such testing increases manufacturing cost and/or reduces production throughput and can lead to a less-than-optimal selection of repair elements for optimizing device yield with respect to the entire device lifetime.

It would therefore be desirable to provide a method and computer program for efficiently optimizing selection of repair elements while taking aging considerations into account, so that the optimum selection of repair elements is not toward an initial nominal device for the design or production run with or without extended performance margins, but rather toward a device performance that will yield the optimum long-term performance and lifetime.

SUMMARY OF THE INVENTION

The objective of efficiently optimizing selection of repair elements to yield optimum long-term performance taking aging into account is provided in a computer program and computer-performed method that may be embodied in a workstation computer system executing the computer program.

The method assigns available redundant elements as replacements for selected elements in the array by finding candidate operating points for which a desired yield of devices will meet operational requirements at beginning-of-life (BOL) when redundancy repair is applied. The model of predicted performance is made using a model that is tuned to correlate to the actual hardware aging. A set of candidate beginning-of-life (BOL) operating points are identified that can be repaired by the redundancy scheme with low failure probability/high yield. Then, for a given BOL operating point repair candidate, each of a number of EOL operating points are modeled by statistical analysis to calculate the yield at EOL, considering that the given operating point has been repaired at BOL. The selected operating point test point is the test point that maximizes the yield computed at the EOL operating points. Failing cells are determined at the selected operating point to select the elements for repair.

If analytical boundaries are specified for the operating points, the EOL yield can be evaluated by numerically integrating the yield distribution according to the aging model between the boundaries for each BOL repair point, after the boundaries have been adjusted for BOL repair and aging effects. Alternatively, conditional importance sampling can be performed to locate distribution points that fail to meet performance criteria at EOL, while ignoring regions that are repaired at BOL, by locating the "center of gravity" (COG) of the importance analysis according to a predicted change in the performance due to aging effects. If performance after aging can be modeled as a systematic shift dependent on process parameters, then the COG at EOL can be determined by providing a similar systematic shift from the COG at BOL. In either technique, if the aging function can be modeled systematically, then the aging-effect adjusted boundaries or the center of gravity of the importance sampling distribution are shifted systematically with respect to BOL calculations for the same operating point.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns methodologies for optimizing selection of repairs within a group of circuits by substitution with redundant elements, such as replacement of rows and/or columns within a static random access memory (SRAM) array. The repairs are optimized so that not only are beginning-of-life (BOL or test-time) failures repaired, but so that long-term aging due to effects such as negative bias temperature instability (NBTI) and positive bias temperature instability (PBTI) are taken into account in the selection of repairs. The effect is to bias the repaired device in the direction favoring longer performance in the face of aging effects at end-of-life (EOL). For example, a cell may have a performance close to the edge of, but within, the "passing range" in a direction away from the likely change in the cell performance due to aging. That cell can be left unrepaired in favor of a cell that has a closer to nominal performance than the unrepaired cell, but that is already biased in the direction of performance change predicted for aging, so that long-term operation of the cell is not compromised by the aging of the circuit.

Rather than testing over numerous additional test operating points in order to accommodate extra margin for aging, and compromising yield or requiring additional redundancy in order to obtain the extra margin, or overstressing the device to predict aging, the present method provides an efficient solution by testing at a smaller number of test operating points. An algorithm that includes a statistical aging model selects the best operating point at which to evaluate performance to select repairs. The best operating point is the test operating point at which the simulated yield at SOL is maximized, thereby providing the best long-term performance of the device, while ensuring that requirements are met at BOL.

Figure 1:
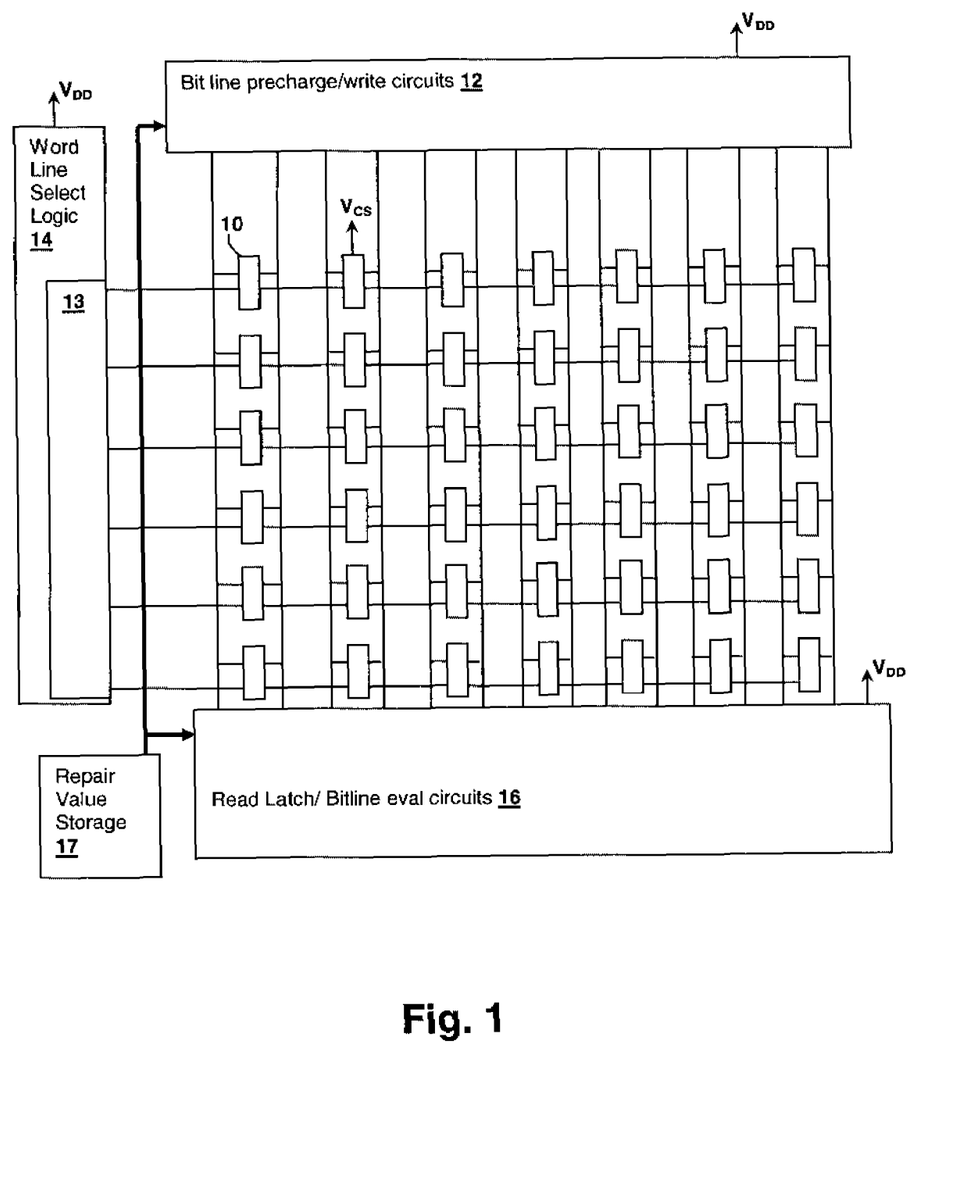
FIG. 1 is a schematic diagram of a memory cell within an array of memory cells that can be modeled in accordance with an embodiment of the invention.

Referring now to FIG. 1, a storage device which may be optimized in accordance with an embodiment of the present invention is shown in the form of an SRAM storage array circuit. A sub-array of storage cells 10, forming rows and columns are connected to read/write access circuitry. The read/write access circuitry include a word line select logic 14, which activates cells 10 in a row according to word line control signals, and a read latch/bit-line evaluation circuit 16 receives the bitline outputs from the storage array composed of storage cells 10. A bitline pre-charge circuit 12 pre-charges the bitlines connected to storage cells 10 in preparation for a storage cell 10 read access, and also sets their values according to input values provided from write logic during storage cell 10 write accesses. Logic and other circuits such as sense amplifiers, within the illustrated storage device is operated from a first power supply voltage $V_{DD}$, while storage cells 10 may be operated from a second power supply voltage $V_{CS}$. A redundancy wordline remapping logic 13 is provided in wordline select logic 14, so that additional redundant rows supplied within the storage array may be selected according to a repair value storage 17, which is generally a fuse array, but may also be a non-volatile memory. A repaired array will have at least one of rows de-selected to be replaced by another one of the rows.

The methods present invention select which rows and/or columns to repair in the storage device of FIG. 1, based on test data obtained by testing the storage device of FIG. 1 against performance requirements, for various operating test points. The operating points include "process corner" test points that are vectors of one or more environmental variables, such as sets of $\{V_{CS}, V_{DD}\}$ values. An exemplary set of test data is shown in Table I, expressed as the standard deviation for the yield versus the $\{V_{CS}, V_{DD}\}$ vector values for a device:

TABLE I

| | $V_{DD}$ | | | | | | | | | | |
|---|---|---|---|---|---|---|---|---|---|---|---|
| $V_{CS}$ | 0.8 | 0.85 | 0.9 | 0.95 | 1.0 | 1.05 | 1.1 | 1.15 | 1.2 | 1.25 | 1.3 |
| 1.3 | 5.51 | 5.51 | 5.53 | 5.50 | 5.41 | 5.39 | 5.34 | 5.29 | 5.20 | 5.15 | 5.10 |
| 1.25 | 5.60 | 5.57 | 5.6 | 5.50 | 5.47 | 5.41 | 5.38 | 5.33 | 5.18 | 5.15 | 5.07 |
| 1.2 | 5.75 | 5.79 | 5.72 | 5.70 | 5.65 | 5.49 | 5.46 | 5.39 | 5.24 | 5.17 | 5.07 |
| 1.15 | 5.96 | 5.92 | 5.85 | 5.83 | 5.75 | 5.66 | 5.53 | 5.42 | 5.38 | 5.18 | 5.05 |
| 1.1 | 6.12 | 6.05 | 6.00 | 5.94 | 5.82 | 5.75 | 5.63 | 5.58 | 5.36 | 5.22 | 5.09 |
| 1.05 | 6.22 | 6.19 | 6.07 | 5.99 | 5.93 | 5.83 | 5.70 | 5.56 | 5.37 | 5.20 | 5.00 |
| 1.0 | 6.31 | 6.22 | 6.13 | 6.01 | 5.90 | 5.79 | 5.64 | 5.45 | 5.25 | 5.05 | 4.86 |
| 0.95 | 6.31 | 6.20 | 6.13 | 5.93 | 5.83 | 5.71 | 5.52 | 5.35 | 5.07 | 4.87 | 4.58 |
| 0.9 | 6.16 | 6.09 | 5.93 | 5.80 | 5.67 | 5.51 | 5.24 | 5.04 | 4.76 | 4.53 | 4.29 |
| 0.85 | 5.98 | 5.84 | 5.72 | 5.54 | 5.36 | 5.18 | 4.96 | 4.71 | 4.42 | 4.14 | 3.92 |
| 0.8 | 5.58 | 5.44 | 5.29 | 5.14 | 4.91 | 4.71 | 4.47 | 4.21 | 3.96 | 3.75 | 3.50 |

In Table I, the operating points shown in bold are a group of operating points selected as candidates for finding the best operating point on which to base the selection of repairs to optimize the use of the redundant elements taking into account aging of the device circuits. No redundancies have been applied at this point. The candidates are selected as meeting or very close to meeting a BOL performance yield near the boundary, which in the example is a specified yield corresponding to a standard deviation of $5\sigma$. The candidates are operating points at which the desired yield at BOL can be obtained by applying redundancy schemes, and in general are more numerous than those shown in the example. The "best" test operating point for maximizing operating range and/or yield at EOL is then selected from the set of candidates by a method in accordance with an embodiment of the invention as described in further detail below.

Table II shows the exemplary yield standard deviation values for the same device, after aging changes due to NBTI occur:

As is seen in Table II, after NBTI aging, none of the operating points selected as candidates from Table I meet the yield specification after aging, as is expected when selecting operating points that lie along the yield criteria boundary in directions that are adversely affected by aging. Since the cell designs are positioned nominally, it is expected that the yields will decrease for all test points with respect to aging, which is true for the device data shown in Tables I and Table II. The goal of the methodologies described below, is to select a particular one of the candidate operating points to use for selecting repairs that consume available redundant repair elements, so that the maximum yield at EOL is produced.

Table III shows exemplary EOL yield standard deviation values for the same device, after repair by cell evaluation according to operating point performance at an operating point selected in accordance with an embodiment of the invention:

TABLE II

| $V_{CS}$ | $V_{DD}$ | | | | | | | | | | |
|---|---|---|---|---|---|---|---|---|---|---|---|
| | 0.8 | 0.85 | 0.9 | 0.95 | 1.0 | 1.05 | 1.1 | 1.15 | 1.2 | 1.25 | 1.3 |
| 1.3 | 4.91 | 5.06 | 5.12 | 5.14 | 5.07 | 5.03 | 4.98 | 4.96 | 4.91 | 4.89 | 4.80 |
| 1.25 | 5.04 | 5.13 | 5.16 | 5.16 | 5.12 | 5.06 | 5.02 | 4.98 | 4.94 | 4.89 | 4.80 |
| 1.2 | 5.24 | 5.22 | 5.24 | 5.21 | 5.18 | 5.11 | 5.09 | 5.02 | 4.96 | 4.89 | 4.80 |
| 1.15 | 5.61 | 5.31 | 5.44 | 5.27 | 5.24 | 5.21 | 5.14 | 5.09 | 4.99 | 4.91 | 4.74 |
| 1.1 | 5.76 | 5.66 | 5.48 | 5.44 | 5.36 | 5.23 | 5.18 | 5.10 | 5.02 | 4.91 | 4.65 |
| 1.05 | 5.78 | 5.78 | 5.49 | 5.58 | 5.39 | 5.24 | 5.18 | 5.10 | 4.99 | 4.82 | 4.48 |
| 1 | 5.87 | 5.80 | 5.72 | 5.61 | 5.45 | 5.25 | 5.15 | 5.02 | 4.89 | 4.70 | 4.29 |
| 0.95 | 5.85 | 5.78 | 5.67 | 5.50 | 5.40 | 5.27 | 5.14 | 4.95 | 4.75 | 4.52 | 3.96 |
| 0.9 | 5.78 | 5.65 | 5.53 | 5.39 | 5.24 | 5.11 | 4.91 | 4.73 | 4.47 | 4.24 | 3.59 |
| 0.85 | 5.54 | 5.38 | 5.30 | 5.15 | 5.04 | 4.80 | 4.61 | 4.38 | 4.10 | 3.86 | 3.33 |
| 0.8 | 5.24 | 5.19 | 5.06 | 4.85 | 4.68 | 4.46 | 4.19 | 3.96 | 3.64 | 3.47 | 4.80 |

TABLE III

| $V_{CS}$ | $V_{DD}$ | | | | | | | | | | |
|---|---|---|---|---|---|---|---|---|---|---|---|
| | 0.8 | 0.85 | 0.9 | 0.95 | 1.0 | 1.05 | 1.1 | 1.15 | 1.2 | 1.25 | 1.3 |
| 1.3 | 4.99 | 5.42 | 8.00 | 8.00 | 8.00 | 5.86 | 5.24 | 5.22 | 5.07 | 4.98 | 4.89 |
| 1.25 | 8.00 | 8.00 | 8.00 | 8.00 | 8.00 | 6.20 | 5.93 | 5.45 | 5.16 | 5.04 | 4.93 |
| 1.2 | 8.00 | 8.00 | 8.00 | 8.00 | 8.00 | 8.00 | 6.24 | 6.18 | 5.19 | 5.06 | 4.93 |
| 1.15 | 8.00 | 8.00 | 8.00 | 8.00 | 8.00 | 8.00 | 8.00 | 8.00 | 8.00 | 5.08 | 4.93 |
| 1.1 | 8.00 | 8.00 | 8.00 | 8.00 | 8.00 | 8.00 | 8.00 | 8.00 | 5.27 | 5.09 | 4.83 |
| 1.05 | 8.00 | 8.00 | 8.00 | 8.00 | 8.00 | 8.00 | 8.00 | 8.00 | 8.00 | 4.98 | 4.69 |
| 1 | 8.00 | 8.00 | 8.00 | 8.00 | 8.00 | 8.00 | 8.00 | 8.00 | 5.06 | 4.75 | 4.51 |
| 0.95 | 8.00 | 8.00 | 8.00 | 8.00 | 8.00 | 8.00 | 8.00 | 5.30 | 4.80 | 4.55 | 4.30 |
| 0.9 | 8.00 | 8.00 | 8.00 | 8.00 | 8.00 | 6.09 | 5.18 | 4.79 | 4.51 | 4.24 | 3.99 |
| 0.85 | 8.00 | 8.00 | 8.00 | 5.87 | 5.42 | 4.88 | 4.65 | 4.40 | 4.11 | 3.86 | 3.58 |
| 0.8 | 6.01 | 5.63 | 5.36 | 4.93 | 4.72 | 4.50 | 4.20 | 3.97 | 3.65 | 3.47 | 3.34 |

In Table III, the selected "best candidate" element is shown in bold. AS is observed from the table, the EOL yield has been dramatically improved by the application of redundancies according to repairs selected by methods of the present invention.

TABLE IV

| $V_{CS}$ | $V_{DD}$ | | | | | | | | | | |
|---|---|---|---|---|---|---|---|---|---|---|---|
| | 0.8 | 0.85 | 0.9 | 0.95 | 1.0 | 1.05 | 1.1 | 1.15 | 1.2 | 1.25 | 1.3 |
| 1.3 | 4.94 | 5.13 | 5.20 | 5.23 | 5.14 | 5.10 | 5.03 | 5.02 | 4.95 | 4.92 | 4.82 |
| 1.25 | 5.09 | 5.21 | 5.24 | 5.25 | 5.18 | 5.12 | 5.09 | 5.03 | 4.99 | 4.92 | 4.84 |
| 1.2 | 5.28 | 5.31 | 5.35 | 5.27 | 5.27 | 5.18 | 5.15 | 5.09 | 5.00 | 4.93 | 4.83 |
| 1.15 | 8.0 | 5.43 | 5.64 | 5.38 | 5.37 | 5.33 | 5.23 | 5.16 | 5.06 | 4.95 | 4.85 |
| 1.1 | 8.0 | 5.39 | 5.60 | 5.59 | 5.60 | 5.36 | 5.33 | 5.20 | 5.10 | 4.95 | 4.77 |
| 1.05 | 8.0 | 8.0 | 5.55 | 8.0 | 5.61 | 5.37 | 5.33 | 5.22 | 5.06 | 4.86 | 4.67 |
| 1 | 8.0 | 8.0 | 8.0 | 8.0 | 8.0 | 5.39 | 5.30 | 5.10 | 4.99 | 4.73 | 4.49 |
| 0.95 | 8.0 | 8.0 | 8.0 | 8.0 | 8.0 | 8.0 | 5.31 | 5.02 | 4.79 | 4.54 | 4.29 |
| 0.9 | 8.0 | 8.0 | 8.0 | 8.0 | 8.0 | 5.87 | 4.95 | 4.76 | 4.49 | 4.24 | 3.99 |
| 0.85 | 8.0 | 8.0 | 8.0 | 6.06 | 5.15 | 4.84 | 4.64 | 4.39 | 4.11 | 3.86 | 3.58 |
| 0.8 | 8.0 | 5.84 | 5.19 | 4.89 | 4.70 | 4.46 | 4.20 | 3.97 | 3.65 | 3.48 | 3.34 |

Table IV shows exemplary yield standard deviation values for the same device, after repair using other selected elements without using the yield-aging evaluation of the present invention. While the EOL yield has been improved due to BOL repairs, the EOL yield has not been improved as much or for as wide a range of operating points as the yield shown in Table III.

Figure 2:
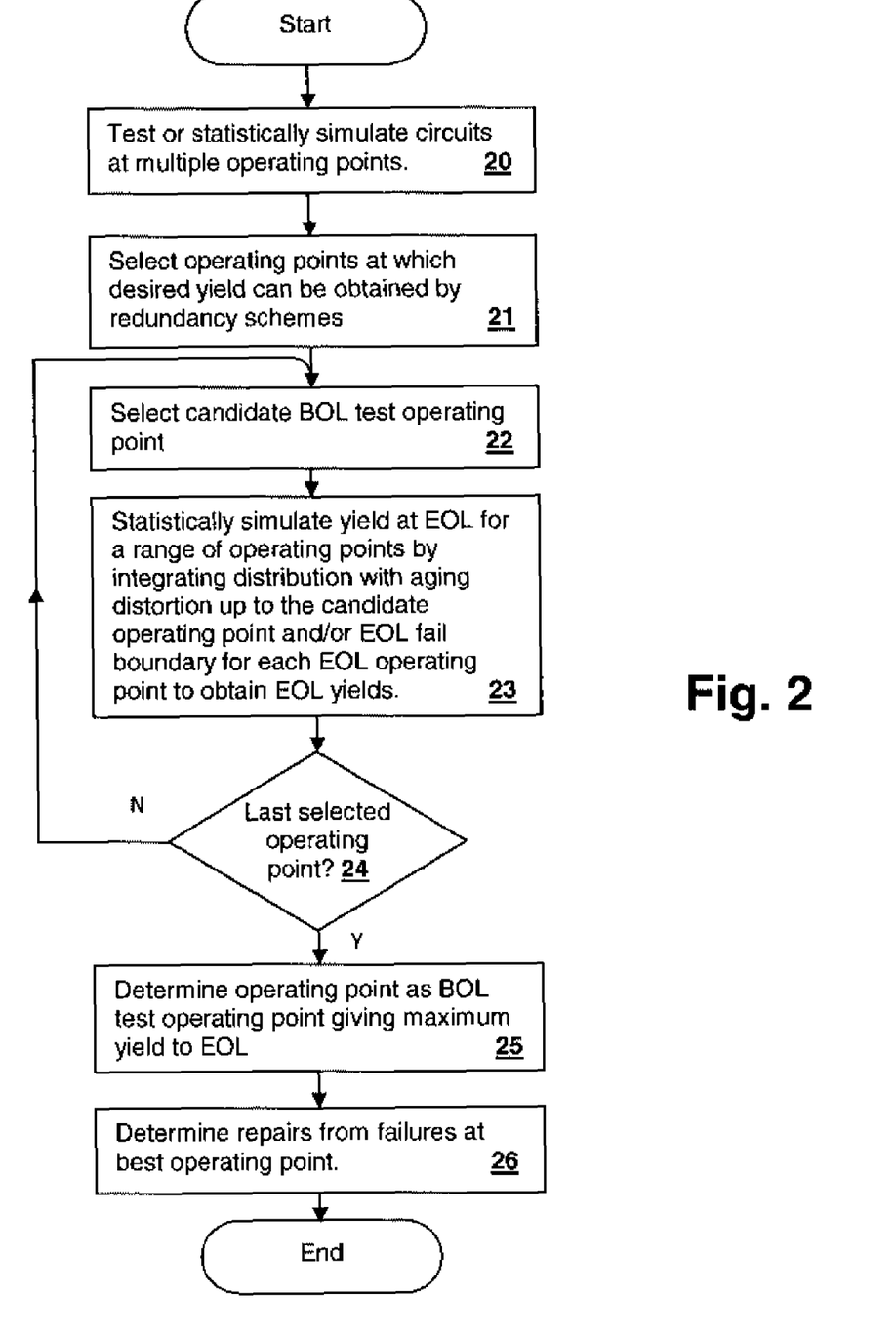
FIG. 2 is a flowchart depicting a method in accordance with an embodiment of the present invention.

Referring now to FIG. 2, a method according to an embodiment of the present invention is illustrated in a flowchart. First, circuits are evaluated, by testing or statistical simulation, at multiple operating points (step 20) and operating points are selected at which the desired yield can be obtained by applying redundancy schemes (step 21). candidate operating points are individually selected (step 22) and the cells are statistically simulated at the desired range of (EOL) operating points with aging by integrating the distribution of test or simulation data along with an aging function up to each EOL operating point boundary and/or an aging distorted repair boundary (step 23). After the last selected operating point has been simulated for aging (decision 24), the "best" operating point is determined as the operating point that provides the greatest yield at EOL for the desired range of operation (step 25). Finally the repairs are determined from the failures present at the determined "best" operating point.

Figure 3:
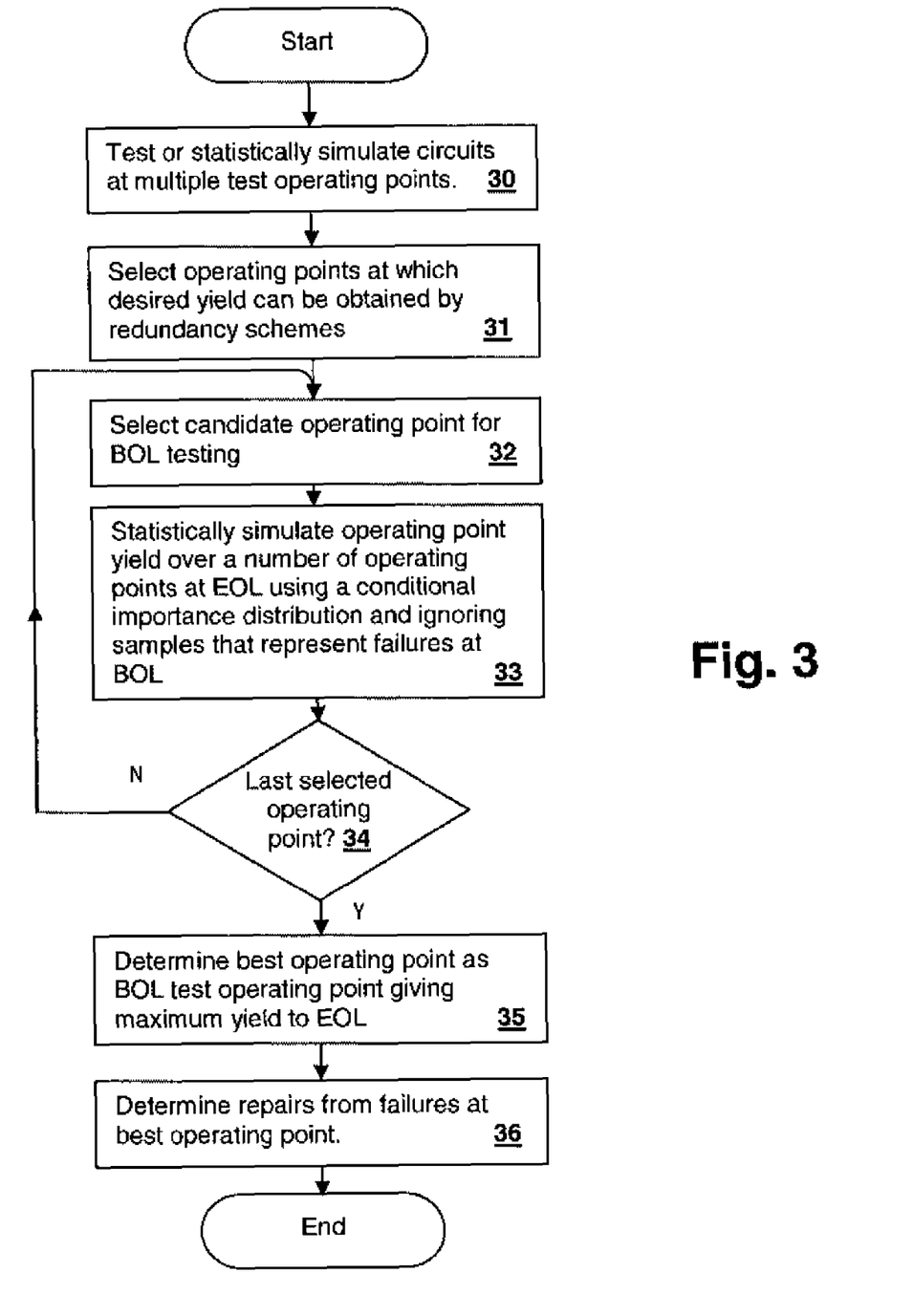
FIG. 3 is a flowchart depicting another method in accordance with another embodiment of the present invention.

Referring now to FIG. 3, another method according to an embodiment of the present invention is illustrated in a flowchart. First, circuits are evaluated, by testing or statistical simulation, at multiple operating points (step 30) and operating points are selected at which the desired yield can be obtained by applying redundancy schemes (step 31). Candidate operating points are individually selected (step 32) and the cells are statistically simulated at EOL for multiple operating points by conditional importance sampling distributions by locating the "center of gravity" (COG) of the importance analysis according to a predicted change in device performance due to aging effects. A failure is counted at EOL only if a failure is not present for the corresponding sample for the candidate operating point at BOL, which indicates that the candidate operating point was not repaired by redundancy based upon a BOL failure at the candidate operating point (step 33). The data from the analysis of the center-of-gravity (COG) at BOL can be re-used to determine a COG for a given ROL analysis at a test point, for example by shifting a center-of-gravity from a given operating point at BOL by a predicted aging displacement to represent the same operating point at EOL. Shifting the BOL COG to the EOL COG is applicable when aging affects the independent process parameters by adding a systematic shift. If the change is not accurately modeled by a shift (translation) of the COG, then other techniques may be applied to improve accuracy. Each sample can be subjected to the aging function to generate a new distribution at EOL, or a projected EOL distribution can be determined from the BOL distribution data by mapping the distributions via functional dependencies other than a shift, as long as the relationship between the BOL distribution and the EOL distribution can be accurately modeled. After the last selected operating point has been simulated for aging (decision 34), the "best" operating point is determined as the operating point that provides the greatest yield at EOL (step 35). Finally the repairs are determined from the failures present at the determined "best" operating point.

Each of the above disclosed methods can be expressed as solving one side of the following equality (dual problems):

$$\int_{v\_op(u^{-1}(y))}^{op i(y)} j(u^{-1}(y)) d(u^{-1}(y)) = \int_{v\_op(x)}^{op_i(u(x))} j(x) d(x)$$

which is equal to the probability of failure $p_f(opi, r\_op)$ for the device, where j is the distribution of cells due to process variation, u( ) is the aging function, r_op is the selected candidate operating point and $op_i$( ) is one of the EOL operating points simulated by the model. The method of FIG. 2 numerically integrates the right hand integral of the equation between the selected operating point and each EOL operating point, while the method of FIG. 3 uses importance sampling around the new distribution determined by the shifted/distorted distribution j around a new center of gravity determined by aging function u( ), according to the left hand integral of the equation. The sampling rejects counts for those points that may be "fixed" (to supply the required EOL yield) using the candidate repair corners as a selection criteria for applying repairs.

Figure 4A:
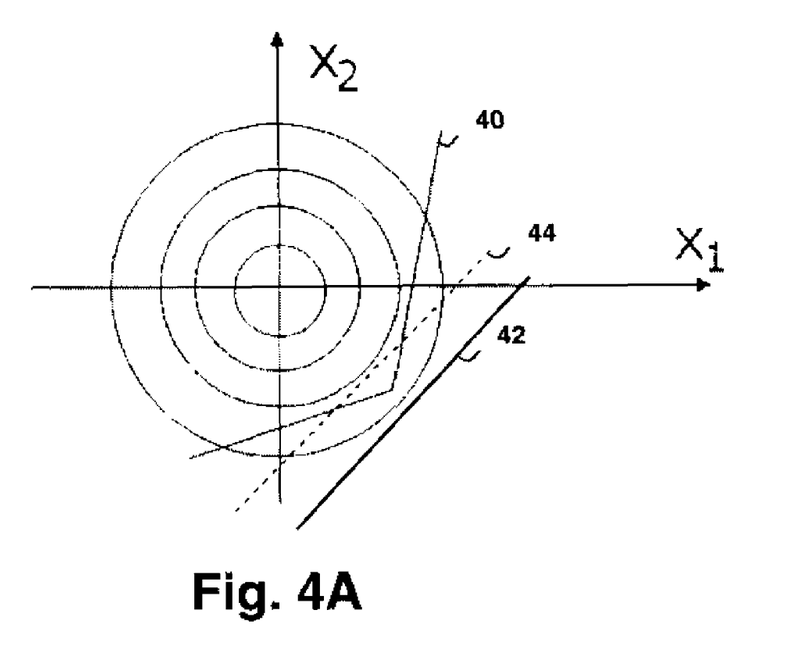
FIGS. 4A-4B are graphs depicting operation of models in accordance with embodiments of the present invention.
Figure 4B:
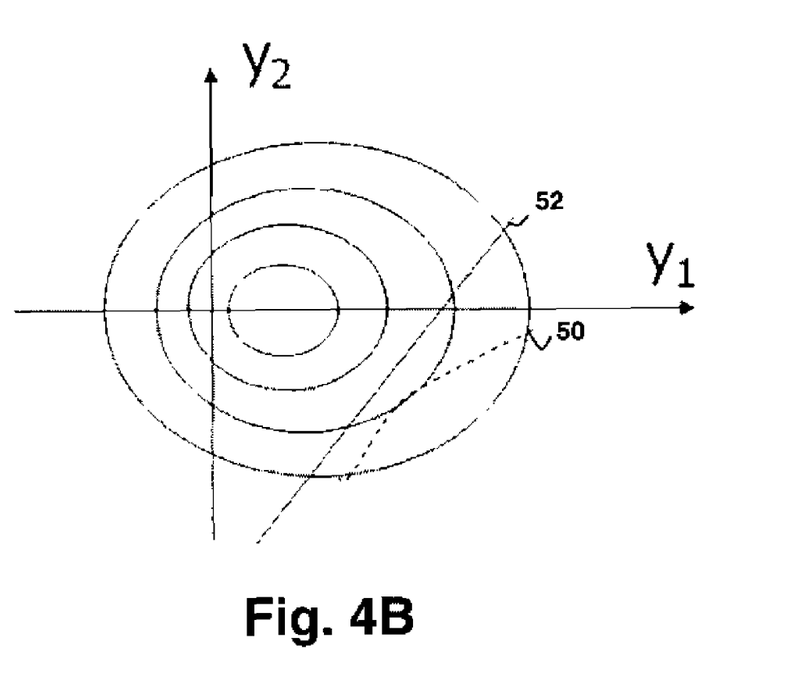

Referring now to FIG. 4A and FIG. 43, graphs illustrating the above described solutions are shown. FIG. 4A illustrates the integration of the method of FIG. 2, in which the actual (BOL) distribution j(x) of test values is represented by the concentric rings in vector space $\{x_1, x_2\}$. The dashed line 44 corresponds to the selected candidate test operating point r_op, while the solid line 42 corresponds to the EOL operating point $op_i$ for which yield being simulated. Bent line 40 corresponds to $op_i(u(x))$ which is the EOL operating point boundary altered by aging function u(x). Aging function u(x) causes $op_i(u(x))$ to show a yield that is lower than predicted at the BOL operating point, due to aging effects. For each selected candidate operating point, the integral of the distribution between dashed line 44 (r_op) and bent line 40 ($op_i(u$ (x))). The selected operating point r_op that provides the maximum yield, i.e., the minimum area between bent line 40 and dashed line 44 provides the "best" candidate operating point for selecting repairs. The dual integral expressed above may also be evaluated directly using the aging distribution.

FIG. 4B illustrates the dual analysis described above, in which the shifted/skewed distribution $j(u^{-1}((y))$ is represented by the outwardly expanding ellipses in vector space in vector space $\{y_1, y_2\}$. Line 52 corresponds to the EOL operating point opt for which yield being simulated. Boundary 50 corresponds to the repair boundary of an altered selected candidate test operating point $r\_op(u^{-1}(y))$ which is distorted due to aging. Integration between the boundaries specified by $r\_op(u^{-1}(y))$ and EOL operating points $op_i$ provides an estimate of yield for a given repair with aging effects taken into consideration. If the boundaries cannot be numerically represented, a sampling technique is used. The goal is to find the EOL yield at operating point $op_i$ under the condition that BOL failures have been repaired at a candidate test operating point located beyond the corresponding boundary $r\_op(u^{-1}(y))$. For a given sample x, a failure is present if $f(u(x), op_i)<f0$ and $f(x, r\_op)>f0$, where f( ) is the performance function for the circuit and f0 is the failure threshold and x is distributed according to j(x). The above criteria ensures that the operating point fails to provide the specified yield with aging and has also not been selected as candidate for repair at r_op, since there is no failure at BOL. The above-described approach can be performed with standard Monte Carlo analysis. However, such analysis is very time-consuming, especially for calculating "rare" failures as is required in memory designs, and therefore the present invention reduces analysis time by relying on conditional importance sampling. First the COG of candidate operating point $op_i$ is found at EOL, and then an importance distribution is used disregarding those sample that fail for operating point r_op at BOL due to the assumption that repairs have remedied such failures at BOL. Alternatively, the dual problem can be solved by sampling in y with y distributed according to aging function $j(u^{-1}(y))$ A failure is present if $f(y, opi)<f0$ and $f(u^{-1}(y), r\_op)>f0$. The selected operating point r_op that provides the maximum yield, e.g., the maximum extension of the area encompassed by altered selected candidate test operating point $r\_op\ (u^{-1}(y))$ corresponding to boundary 50 over a set of points $op_i$, provides the "best" candidate operating point for selecting repairs.

Figure 5:
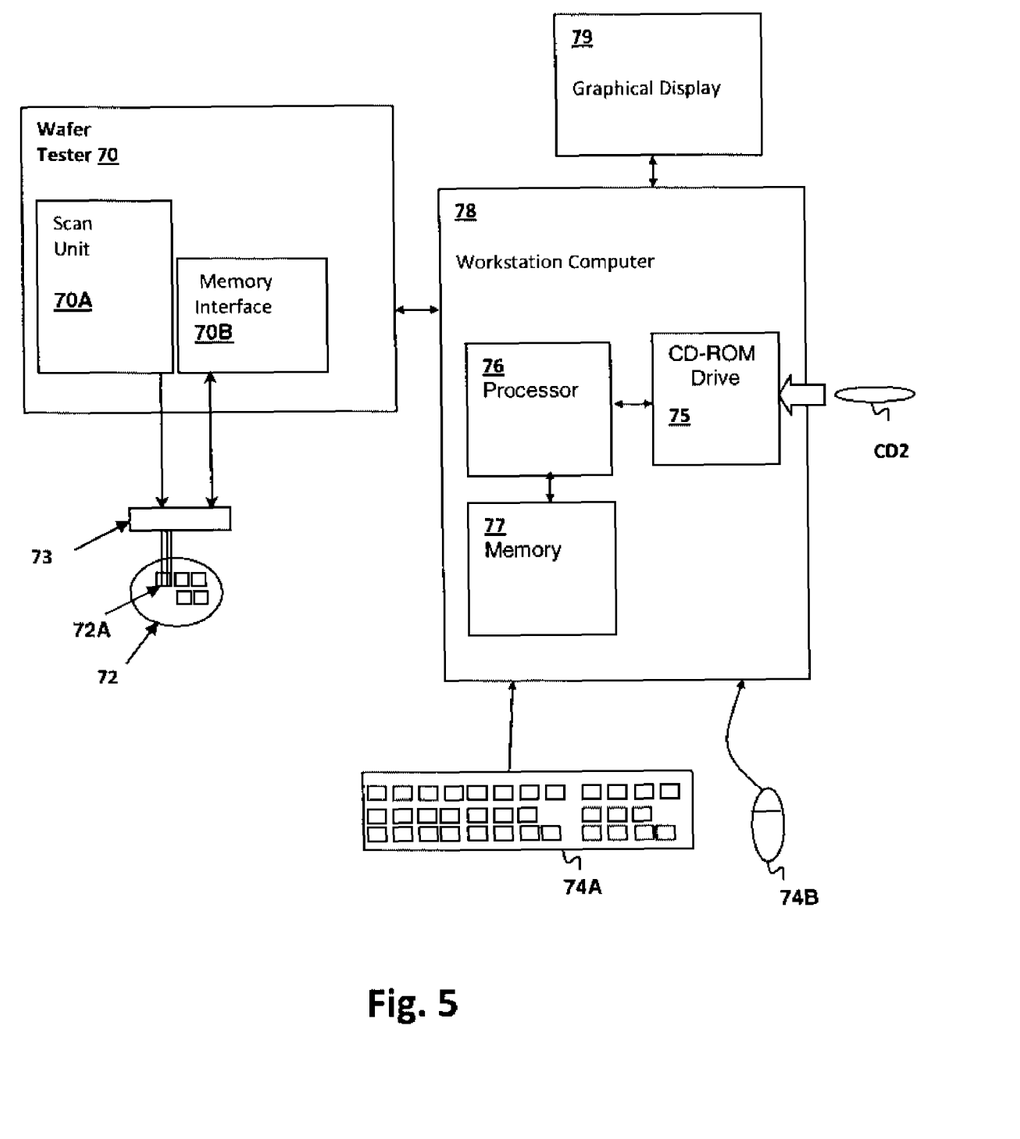
FIG. 5 is a pictorial diagram depicting a workstation computer system in which the methods of the present invention can be practiced by executing program instructions of a computer program product in accordance with an embodiment of the present invention.

Referring now to FIG. 5, a VLSI wafer test system for performing the analysis described above to select repairs and optionally for applying the repairs is depicted. A wafer tester 70 includes a boundary scan unit 70A for providing stimulus to and retrieving data from a die 72A on a wafer under test 72 via a probe head 73 having electrical test connections to die 72A. Wafer tester 70 includes a memory interface 70B for exercising a storage device in accordance with an embodiment of the present invention that is integrated on die 72A. Wafer tester 70 may also include provisions as a system for effecting the repairs, by altering fuses or providing mask output for device alteration.

A workstation computer 78, has a processor 76 coupled to a memory 77, for executing program instructions from memory 77, wherein the program instructions include program instructions for performing the methods described above on data collected from tests of the storage devices integrated on die 72A, by receiving data from memory interface tester 70B and optionally transferring control values to and from scan unit 70A. A programmable voltage source 70C is provided for altering power supply voltages provided to devices on die 72A during the testing process. Workstation computer 78 is coupled to wafer tester 70 via an electrical interface. Generally, the test methodology operates memory interface 70B under controlled environmental characteristics such as temperature and the power supply voltage vectors to test the storage device, including varying the frequency of operation and/or other timing characteristics provided by memory interface 70B to detect failures within the storage devices on die 72A. Once any repairs are determined, die 72A may be altered as described above. Compact disc CD can contain program instructions for performing the testing methods and analyses of the present invention according to a computer program.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A computer-performed method executed within a computer system for selecting repairs for a group of circuits having redundant elements for providing repair by replacing portions of the group of circuits with the redundant elements, comprising: evaluating the group of circuits at multiple test operating points of at least one environmental variable of the group of circuits, wherein the evaluating determines whether or not circuits within the group of circuits fail to meet required performance characteristics prior to aging; within the computer system, modeling an end-of-life yield using a model dependent on both a aging function and a result of the evaluating at multiple test operating points in accordance with the required performance characteristics; determining which of the multiple test operating points maximizes the end-of-life yield for the group of circuits as a selected candidate test operating point; using failure determinations at the selected candidate test operating point to select which portions of the group of circuits to replace with the redundant elements; and storing in a storage of the computer system, an indication of the selected portions of the group of circuits as portions marked for repair.

2. The computer-performed method of claim 1, wherein the group of circuits is a group of storage cells within a storage array, wherein the evaluating evaluates operation of the storage cells, wherein the redundant elements are redundant rows or columns of the storage array, and wherein the storing stores an indication of a row or column for marked for replacement by one of the redundant rows or columns.

3. The computer-performed method of claim 2, further comprising altering a device containing the storage array to replace the marked row or column candidate element with one of the redundant rows or columns.

4. The computer-performed method of claim 1, wherein the multiple test operating points are vectors including at least one test power supply voltage of the group of circuits.

5. The computer-performed method of claim 1, wherein the determining which of the multiple test operating points maximizes the end-of-life yield for the group of circuits as the selected candidate comprises:
 selecting one of the multiple test operating points for which repair can be affected by providing repair with the redundant elements to meet a required yield at testing time;
 statistically modeling the end-of-life yield for said group of circuits from the aging model and the selected test operating point for a number of other operating points corresponding to end-of-life of the storage array; and
 repeating the selecting and statistically modeling for each of the multiple test operating points, and wherein the determining which of the multiple test operating points maximizes the end-of-life yield for the group of circuits as the selected candidate selects a test operating point having the greatest end-of-life yield.

6. The computer-performed method of claim 5, wherein the statistically modeling comprises numerically integrating an aging function applied to the distribution of failures up to a boundary defined by the selected test operating point to obtain the end-of-life yield.

7. The computer-performed method of claim 5, wherein the statistically modeling comprises:
performing conditional importance sampling using a conditional importance sampling distribution determined from the aging model and data representing the result of the evaluating at multiple test operating points in accordance with the required performance characteristics; and
determining the end-of-life yield from the conditional importance sampling distribution.

8. A workstation computer system comprising a processor for executing program instructions and a memory coupled to said processor for storing program instructions, said program instructions including program instructions for selecting repairs for a group of circuits having redundant elements for providing repair by replacing portions of the group of circuits with the redundant elements, the program instructions comprising program instructions for:
evaluating the group of circuits at multiple test operating points of at least one environmental variable of the group of circuits, wherein the evaluating determines whether or not circuits within the group of circuits fail to meet required performance characteristics prior to aging;
modeling an end-of-life yield using a model dependent on both a aging function and a result of the evaluating at multiple test operating points in accordance with the required performance characteristics;
determining which of the multiple test operating points maximizes the end-of-life yield for the group of circuits as a selected candidate test operating point;
using failure determinations at the selected candidate test operating point to select which portions of the group of circuits to replace with the redundant elements; and
storing in a storage of the computer system, an indication of the selected portions of the group of circuits as portions marked for repair.

9. The workstation computer of claim 8, wherein the group of circuits is a group of storage cells within a storage array, wherein the program instructions for evaluating evaluate operation of the storage cells, wherein the redundant elements are redundant rows or columns of the storage array, and wherein the program instructions for storing store an indication of a row or column for marked for replacement by one of the redundant rows or columns.

10. The workstation computer system of claim 9, further comprising program instructions for controlling a system to alter a device containing the storage array to replace the marked row or column candidate element with one of the redundant rows or columns.

11. The workstation computer system of claim 8, wherein the multiple test operating points are vectors including at least one test power supply voltage of the group of circuits.

12. The workstation computer system of claim 8, wherein the program instructions for determining which of the multiple test operating points maximizes the end-of-life yield for the group of circuits as the selected candidate comprise program instructions for:
selecting one of the multiple test operating points for which repair can be affected by providing repair with the redundant elements to meet a required yield at testing time;
statistically modeling the end-of-life yield for said group of circuits from the aging model and the selected test operating point for a number of other operating points corresponding to end-of-life of the storage array; and
repeating the selecting and statistically modeling for each of the multiple test operating points, and wherein the determining which of the multiple test operating points maximizes the end-of-life yield for the group of circuits as the selected candidate selects a test operating point having the greatest end-of-life yield.

13. The workstation computer system of claim 12, wherein the program instructions for statistically modeling comprise program instructions for numerically integrating a distribution representing the present-time yield for the group of cells up to a boundary defined by the selected test operating point to obtain the end-of-life yield.

14. The workstation computer system of claim 12, wherein the program instructions for statistically modeling comprise program instructions for:
performing conditional importance sampling using a conditional importance sampling distribution determined from the aging model and data representing the result of the evaluating at multiple test operating points in accordance with the required performance characteristics; and
determining the end-of-life yield from the conditional importance sampling distribution.

15. A computer program product comprising computer-readable storage media encoding program instructions for execution on a workstation computer system, wherein said program instructions include program instructions for selecting repairs for a group of circuits having redundant elements for providing repair by replacing portions of the group of circuits with the redundant elements, the program instructions comprising program instructions for: evaluating the group of circuits at multiple test operating points of at least one environmental variable of the group of circuits, wherein the evaluating determines whether or not circuits within the group of circuits fail to meet required performance characteristics prior to aging; modeling an end-of-life yield using a model dependent on both a aging function and a result of the evaluating at multiple test operating points in accordance with the required performance characteristics; determining which of the multiple test operating points maximizes the end-of-life yield for the group of circuits as a selected candidate test operating point; using failure determinations at the selected candidate test operating point to select which portions of the group of circuits to replace with the redundant elements; and storing in a storage of the computer system, an indication of the selected portions of the group of circuits as portions marked for repair.

16. The computer program product of claim 15, wherein the group of circuits is a group of storage cells within a storage array, wherein the program instructions for evaluating evaluate operation of the storage cells, wherein the redundant elements are redundant rows or columns of the storage array, and wherein the program instructions for storing store an indication of a row or column for marked for replacement by one of the redundant rows or columns.

17. The computer program product of claim 16, further comprising program instructions for controlling a system to alter a device containing the storage array to replace the marked row or column candidate element with one of the redundant rows or columns.

18. The computer program product of claim 15, wherein the program instructions for determining which of the multiple test operating points maximizes the end-of-life yield for the group of circuits as the selected candidate comprise program instructions for:
- selecting one of the multiple test operating points for which repair can be affected by providing repair with the redundant elements to meet a required yield at testing time;
- statistically modeling the end-of-life yield for said group of circuits from the aging model and the selected test operating point for a number of other operating points corresponding to end-of-life of the storage array; and
- repeating the selecting and statistically modeling for each of the multiple test operating points, and wherein the determining which of the multiple test operating points maximizes the end-of-life yield for the group of circuits as the selected candidate selects a test operating point having the greatest end-of-life yield.

19. The computer program product of claim 18, wherein the program instructions for statistically modeling comprise program instructions for numerically integrating an aging function applied to the distribution of failures up to a boundary defined by the selected test operating point to obtain the end-of-life yield.

20. The computer program product of claim 18, wherein the program instructions for statistically modeling comprise program instructions for:
- performing conditional importance sampling using a conditional importance sampling distribution determined from the aging model and data representing the result of the evaluating at multiple test operating points in accordance with the required performance characteristics; and
- determining the end-of-life yield from the conditional importance sampling distribution.

* * * * *